United States Patent
Jafari et al.

(10) Patent No.: US 6,894,385 B1
(45) Date of Patent: May 17, 2005

(54) INTEGRATED CIRCUIT PACKAGE HAVING BYPASS CAPACITORS COUPLED TO BOTTOM OF PACKAGE SUBSTRATE AND SUPPORTING SURFACE MOUNTING TECHNOLOGY

(75) Inventors: Behdad Jafari, Saratoga, CA (US); Ray Chen, Fremont, CA (US)

(73) Assignee: nVidia Corporation, Santa Clara, CA (US)

( * ) Notice: Subject to any disclaimer, the term of this patent is extended or adjusted under 35 U.S.C. 154(b) by 0 days.

(21) Appl. No.: 10/717,342

(22) Filed: Nov. 18, 2003

(51) Int. Cl.[7] .............................................. H01L 23/34
(52) U.S. Cl. ........................ 257/724; 257/778; 257/777
(58) Field of Search ................................ 257/724, 777, 257/778, 693, 678

(56) References Cited

U.S. PATENT DOCUMENTS

| | | | | |
|---|---|---|---|---|
| 5,939,782 A | * | 8/1999 | Malladi | 257/698 |
| 6,353,540 B1 | * | 3/2002 | Akiba et al. | 361/794 |
| 6,400,576 B1 | * | 6/2002 | Davidson | 361/763 |
| 6,518,666 B1 | * | 2/2003 | Ikeda | 257/738 |
| 6,535,398 B1 | * | 3/2003 | Moresco | 361/792 |
| 6,727,780 B2 | * | 4/2004 | Novak et al. | 333/136 |
| 2002/0011662 A1 | * | 1/2002 | Komiya et al. | 257/728 |
| 2002/0074653 A1 | * | 6/2002 | Khandros et al. | 257/724 |
| 2002/0185308 A1 | * | 12/2002 | Cornelius et al. | 174/260 |

FOREIGN PATENT DOCUMENTS

JP        61-24255   *  2/1986   .................. 257/724

* cited by examiner

*Primary Examiner*—Jasmine Clark
(74) *Attorney, Agent, or Firm*—Wagner, Murabito & Hao LLP

(57) ABSTRACT

An integrated circuit package is disclosed. The integrated circuit package includes a package substrate having a top and a bottom. Further, the integrated circuit package includes a plurality of bypass capacitors coupled to the bottom of the package substrate without a cavity. Moreover, the integrated circuit package includes an array of solder balls formed on the bottom of the package substrate. The array of solder balls facilitates surface mounting to a printed circuit board assembly. Also, the solder balls provide sufficient space between the printed circuit board assembly and the bypass capacitors. In an embodiment, the package substrate is an organic substrate.

18 Claims, 8 Drawing Sheets

TOP VIEW

BOTTOM VIEW

INTEGRATED CIRCUIT PACKAGE HAVING BYPASS CAPACITORS COUPLED TO BOTTOM OF PACKAGE SUBSTRATE AND SUPPORTING SURFACE MOUNTING TECHNOLOGY

BACKGROUND OF THE INVENTION

1. Field of the Invention

Embodiments of the present invention generally relate to integrated circuit packages. More particularly, embodiments of the present invention relate to integrated circuit packages having bypass capacitors coupled to the bottom of the package substrate and supporting surface mounting technology.

2. Related Art

Typically, the integrated circuit chip die is not directly attached to a printed circuit board assembly. Rather, the integrated circuit chip die is attached to a top of a package substrate. Organic substrates and ceramic substrates are the most widely used types of package substrates. In general, the organic substrate is comprised of multi-layers of organic material while the ceramic substrate is comprised of multi-layers of ceramic material. The bottom of the package substrate usually has solder balls, pins, or other means to attach the integrated circuit package (which includes the integrated circuit chip die and the package substrate) directly to the printed circuit board assembly or directly to a socket that is attached to the printed circuit board assembly. Moreover, different techniques are used to couple bypass capacitors (also referred as decoupling capacitors) to the package substrate. The bypass capacitors are more effective if coupled to the bottom of the package substrate rather than to the top of the package substrate. The bypass capacitors placed between signal lines reduce the electrical noise of the signal lines. Additionally, the bypass capacitors placed between power line and ground line reduce power surges in the power and ground lines.

FIG. 1 illustrates a cross-sectional view of a first conventional electronic assembly 100, showing one method of coupling bypass capacitors to the bottom of the package substrate 20. The conventional electronic assembly 100 includes a chip die 10, a package substrate 20 that is a ceramic substrate 20, and a printed circuit board assembly (PCBA) 30 usually comprised of an organic material. The chip die 10 is coupled to the top of the ceramic substrate 20 in a flip-chip configuration. Moreover, solder bumps 12 couple the chip die 10 to the ceramic substrate 20. Additionally, the integrated circuit package 50 is comprised of the chip die 10 and the ceramic substrate 20.

The ceramic substrate 20 includes an array of solder balls 22 at the bottom. Hence, the integrated circuit package 50 is a BGA (Ball Grid Array) package. The solder balls 22 facilitate surface mounting the integrated circuit package 50 to the PCBA 30. Additionally, the ceramic substrate 20 has cavity1 and cavity2 formed in the bottom of the ceramic substrate 20. Bypass capacitor1 is coupled and located in cavity1 while bypass capacitor2 is coupled and located in cavity2, allowing the integrated circuit package 50 to be surface mounted to the PCBA 30.

The first conventional electronic assembly 100 has several deficiencies. Organic substrates are less expensive than ceramic substrates. However, forming cavities for the bypass capacitors in the bottom of an organic substrate is expensive and not practical for organic substrates. Moreover, the thermal expansion properties of the ceramic substrate 20 and the PCBA 30 are mismatched, putting great stress on the solder balls 22 and reducing reliability. The thermal expansion rate of the PCBA 30 is greater than the thermal expansion rate of the ceramic substrate 20.

FIG. 2 illustrates a cross-sectional view of a second conventional electronic assembly 200, showing a second method of coupling bypass capacitors to the bottom of the package substrate 20. The second conventional electronic assembly 200 includes a chip die 10, a package substrate 20 (can be organic or ceramic), a socket 60, and a printed circuit board assembly (PCBA) 30 usually comprised of an organic material. Here, the chip die 10 is coupled to the top of the package substrate 20 in a flip-chip configuration. However, the chip die 10 can also be coupled to the top of the package substrate 20 in a wire bonding configuration. Moreover, solder bumps 12 couple the chip die 10 to the package substrate 20. Additionally, the integrated circuit package 50 is comprised of the chip die 10 and the package substrate 20.

The package substrate 20 includes an array of solder balls 22 at the bottom. Hence, the integrated circuit package 50 is a BGA (Ball Grid Array) package. The solder balls 22 facilitate mounting the integrated circuit package 50 to the socket 60. Alternatively, the package substrate 20 can have pins rather than solder balls 22.

Moreover, bypass capacitors 71 and 72 are coupled to the bottom of the package substrate 20. A cavity 65 is milled out in the center of the socket 60, which is mounted to the PCBA 30 via pins 40. The cavity 65 provides clearance to enable the bypass capacitors 71 and 72 to be coupled to the bottom of the package substrate 20.

Unfortunately, the second conventional electronic assembly 200 also has several deficiencies. Use of the socket 60 increases costs. Moreover, the height of the socket 60 and PCBA 30 combination is too large for many applications.

SUMMARY OF THE INVENTION

An integrated circuit package is disclosed. The integrated circuit package includes a package substrate having a top and a bottom. Further, the integrated circuit package includes a plurality of bypass capacitors coupled to the bottom of the package substrate without a cavity. Moreover, the integrated circuit package includes an array of solder balls formed on the bottom of the package substrate. The array of solder balls facilitates surface mounting to a printed circuit board assembly. Also, the solder balls provide sufficient space between the printed circuit board assembly and the bypass capacitors. In an embodiment, the package substrate is an organic substrate.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

Figure 3A:
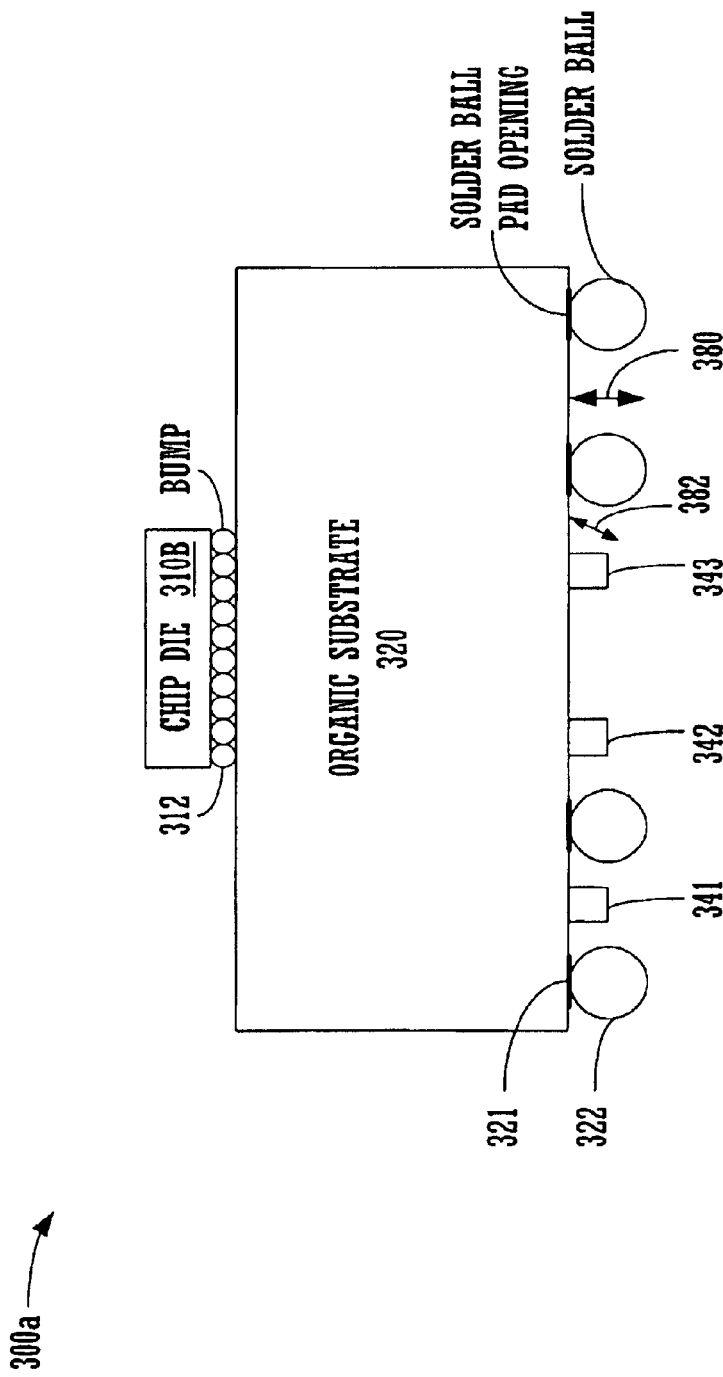
FIG. 3A illustrates a cross-sectional view of an integrated circuit package in accordance with an embodiment of the present invention, showing a chip die in a flip-chip configuration.

FIG. 3A illustrates a cross-sectional view of an integrated circuit package 300A in accordance with an embodiment of the present invention, showing a chip die 310 in a flip-chip configuration. The integrated circuit package 300A includes a chip die 310, an organic substrate 320, and a plurality of bypass capacitors 341–343. The chip die 310 is coupled to the top of the organic substrate 320 in a flip-chip configuration. Moreover, solder bumps 312 couple the chip die 310 to the organic substrate 320. In an embodiment, the organic substrate 320 is comprised of an epoxy-glass resin.

The organic substrate 320 includes an array of solder balls 322 formed at the bottom of the organic substrate 320. Hence, the integrated circuit package 300A is a BGA (Ball Grid Array) package. The solder balls 322 facilitate surface mounting the integrated circuit package 300A to a PCBA (See FIG. 5) without the need for a socket. That is, the solder balls 322 facilitate mechanical bonding and electrical coupling to the PCBA (See FIG. 5) when using any SMT (Surface Mount Technology) technique. The solder balls 322 are coupled to solder-ball pads (not shown) on the bottom of the organic substrate 320. For each solder-ball pad, a solder-ball pad opening 321 on the bottom of the organic substrate 320 provides the solder ball 322 access to the solder-ball pad.

Figure 1:
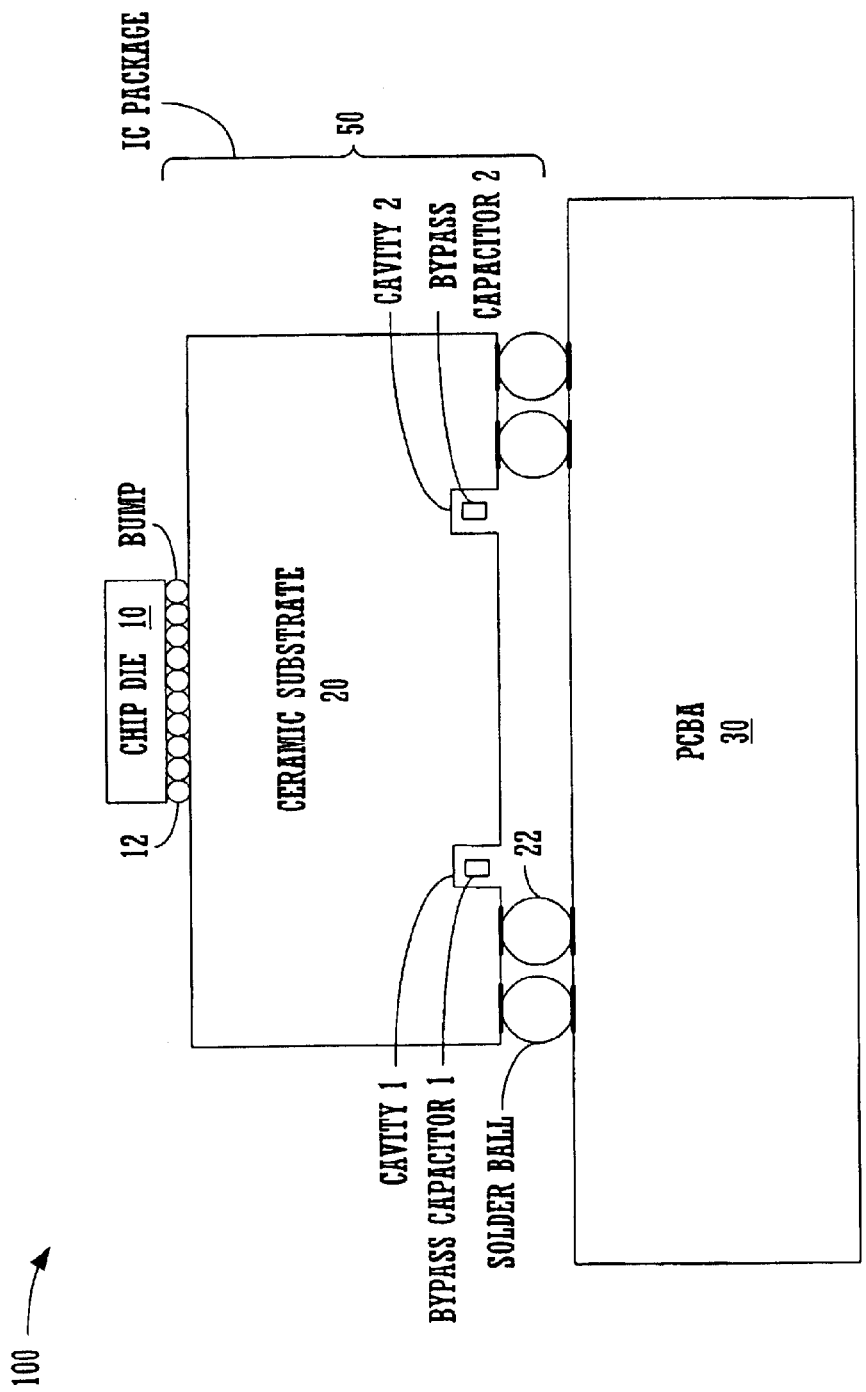
FIG. 1 illustrates a cross-sectional view of a first conventional electronic assembly, showing one method of coupling bypass capacitors to the bottom of the package substrate.
Figure 2:
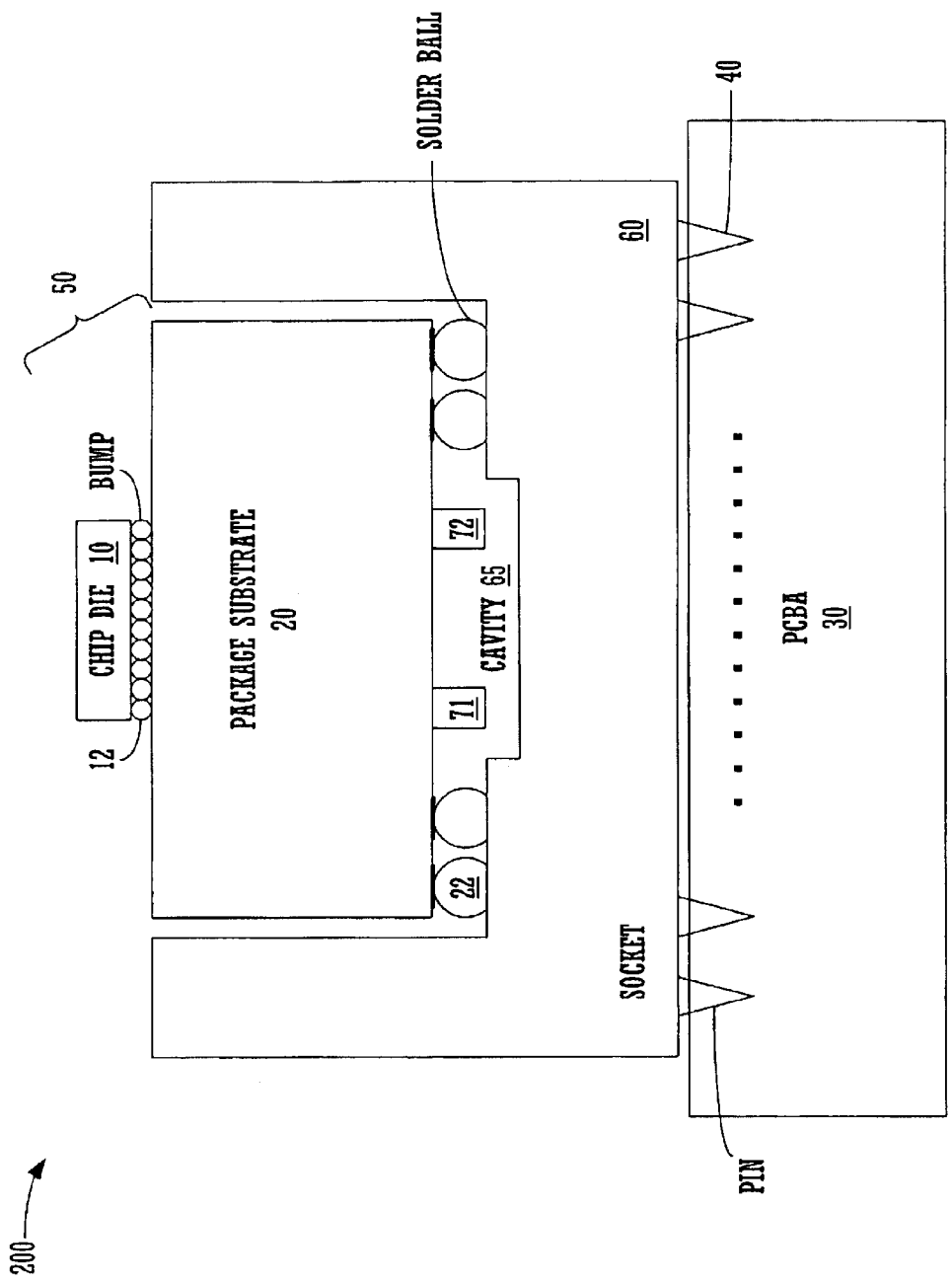
FIG. 2 illustrates a cross-sectional view of a second conventional electronic assembly, showing a second method of coupling bypass capacitors to the bottom of the package substrate.
Figure 4A:
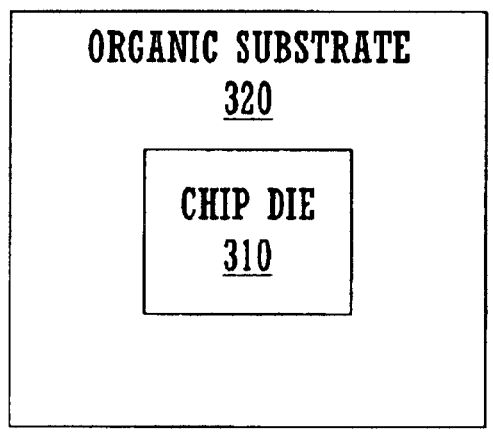
FIG. 4A illustrates a top view of the integrated circuit package of FIG. 3A.
Figure 4B:
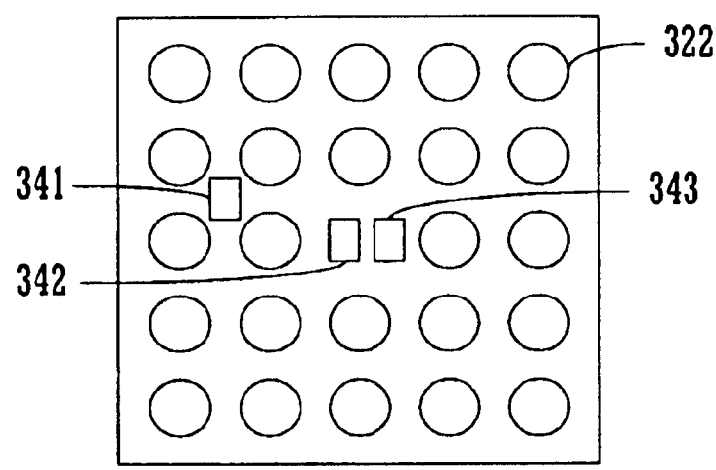
FIG. 4B illustrates a bottom view of the integrated circuit package of FIG. 3A.

Moreover, the plurality of bypass capacitors 341–343 are coupled to the bottom of the organic substrate 320 without a cavity, unlike the ceramic substrate 20 of FIG. 1 which included cavities for the bypass capacitors. The plurality of bypass capacitors 341–343 can be coupled in a variety of places on the bottom of the organic substrate 320. For example, bypass capacitors 342 and 343 are coupled directly under the chip die 310 or in the center of the bottom of the organic substrate 320, which makes them more effective as bypass capacitors. Moreover, bypass capacitor 341 is coupled between adjacent solder balls. This placement is effective in dealing with electrically noisy and adjacent solder balls. Additionally, a greater number of bypass capacitors 341–343 can be coupled to the organic substrate 320 than previously possible. FIG. 4A illustrates a top view of the integrated circuit package 300A of FIG. 3A, showing that the chip die 310 is centered on the top of the organic substrate 320. FIG. 4B illustrates a bottom view of the integrated circuit package 300A of FIG. 3A, showing bypass capacitors 342 and 343 coupled to a center of the bottom of the organic substrate 320 and showing bypass capacitor 341 coupled between adjacent solder balls 322. It should be understood that the array of solder balls 322 can have other configurations.

Figure 5:
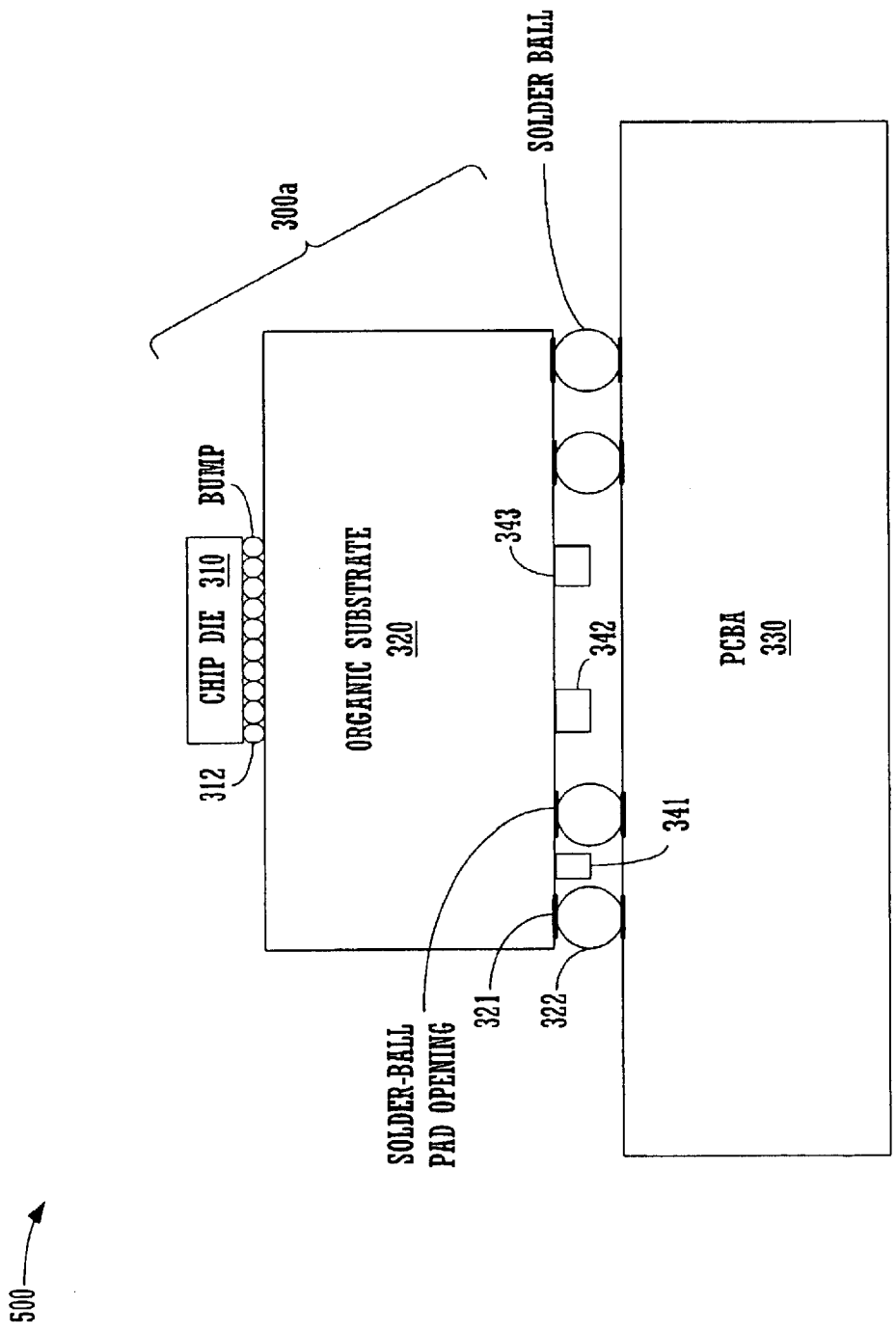
FIG. 5 illustrates a cross-sectional view of an electronic assembly in accordance with an embodiment of the present invention.

Returning to FIG. 3A, the height 380 of each solder ball 322 has to be controlled to provide sufficient clearance or space for the height 382 of the bypass capacitors 341–343 when the integrated circuit package 300A is surface mounted to a PCBA (See FIG. 5). Generally, the bypass capacitors 341–343 are selected such that the height 382 of each bypass capacitor 341–343 is as small as possible. Several parameters influence the height 380 of the solder balls 322. For example, a desired height for the solder ball 322 can be obtained by selecting the appropriate diameter for the solder ball 322, the appropriate shape for the solder ball 322, the appropriate shape for the solder-ball pad opening 321, and the appropriate size for the solder-ball pad opening 321. Moreover, solder balls 322 support greater densities for interconnections to a PCBA than pins, leading to a smaller size for the integrated circuit package 300A. Hence, even if the height 380 of the solder ball is increased to provide sufficient clearance or space for the height 382 of the bypass capacitors 341–343 when the integrated circuit package 300A is surface mounted to a PCBA (See FIG. 5), the impact on solder ball density and on the size of the integrated circuit package 300A can be minimized. In an embodiment, a height 380 of each solder ball 322 is approximately 0.5 millimeters while the height 382 of each bypass capacitor 341–343 is approximately between 0.325 millimeters and 0.350 millimeters.

Figure 3B:
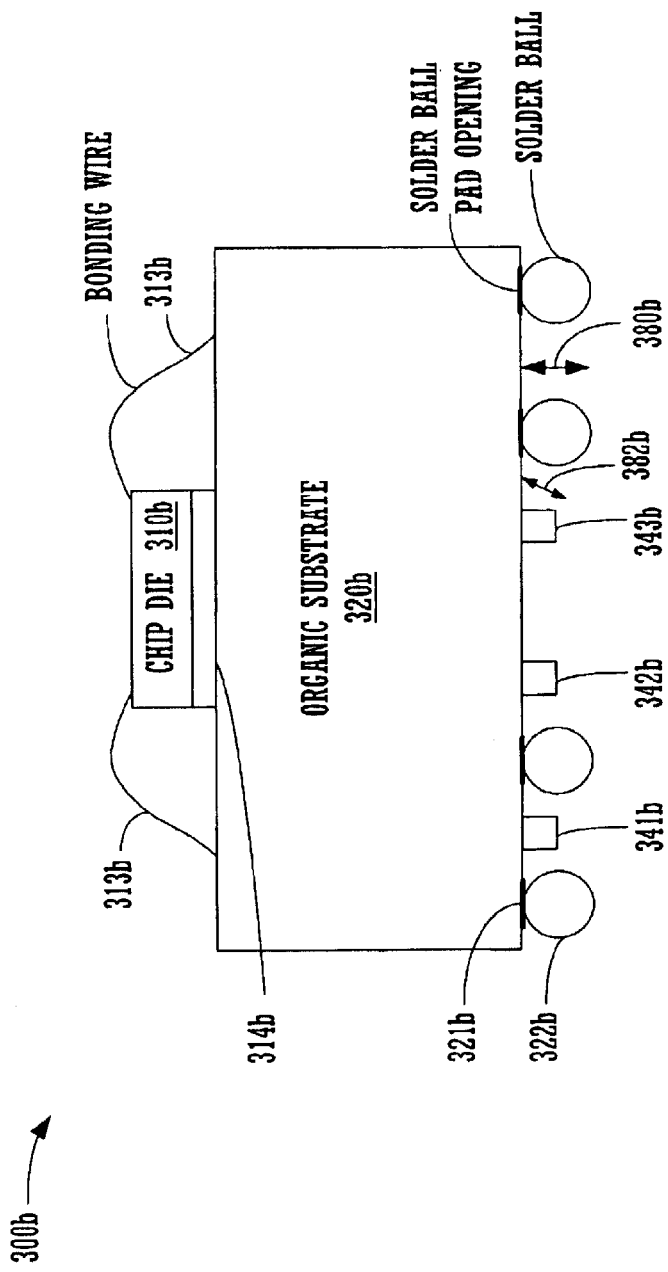
FIG. 3B illustrates a cross-sectional view of an integrated circuit package in accordance with an embodiment of the present invention, showing a chip die in a wire bonding configuration.

FIG. 3B illustrates a cross-sectional view of an integrated circuit package 300B in accordance with an embodiment of the present invention, showing a chip die 310B in a wire bonding configuration. The integrated circuit package 300B includes a chip die 310B, an organic substrate 320B, and a plurality of bypass capacitors 341B–343B. The chip die 310B is coupled to the top of the organic substrate 320 in a wire bonding configuration. Moreover, the bonding material 314B couples the chip die 310B to the top of the organic substrate 320B. A plurality of bonding wires 313B extends between the chip die 310B and the top of the organic substrate 320B. In an embodiment, the organic substrate 320B is comprised of an epoxy-glass resin.

The organic substrate 320B includes an array of solder balls 322B formed at the bottom of the organic substrate 320B. Hence, the integrated circuit package 300B is a BGA (Ball Grid Array) package. The solder balls 322B facilitate surface mounting the integrated circuit package 300B to a PCBA without the need for a socket. That is, the solder balls 322B facilitate mechanical bonding and electrical coupling to the PCBA when using any SMT (Surface Mount Technology) technique. The solder balls 322B are coupled to solder-ball pads (not shown) on the bottom of the organic substrate 320B. For each solder-ball pad, a solder-ball pad opening 321B on the bottom of the organic substrate 320B provides the solder ball 322B access to the solder-ball pad.

Moreover, the plurality of bypass capacitors 341B–343B are coupled to the bottom of the organic substrate 320B without a cavity, unlike the ceramic substrate 20 of FIG. 1 which included cavities for the bypass capacitors. The plurality of bypass capacitors 341B–343B can be coupled in a variety of places on the bottom of the organic substrate 320B. For example, bypass capacitors 342B and 343B are coupled directly under the chip die 310B or in the center of the bottom of the organic substrate 320B, which makes them more effective as bypass capacitors. Moreover, bypass capacitor 341B is coupled between adjacent solder balls. This placement is effective in dealing with electrically noisy and adjacent solder balls.

Again as discussed above, the height 380B of each solder ball 322B has to be controlled to provide sufficient clearance or space for the height 382B of the bypass capacitors 341B–343B when the integrated circuit package 300B is surface mounted to a PCBA (See FIG. 5). In an embodiment, a height 380B of each solder ball 322B is approximately 0.5 millimeters while the height of each bypass capacitor 341B–343B is approximately between 0.325 millimeters and 0.350 millimeters.

It should be understood that the chip die can be coupled to the top of the organic substrate in other configurations. Moreover, integrated circuit packages 300A and 300B are well suited for a variety of applications. Examples of these applications include graphical processing units (GPU), graphic chipsets, and any other type of application requiring bypass capacitors.

FIG. 5 illustrates a cross-sectional view of an electronic assembly 500 in accordance with an embodiment of the present invention. The integrated circuit package 300A is surface mounted to a PCBA 330 without the need for a socket. The solder balls 322 provide sufficient space between the heights of the bypass capacitors 341–343 coupled to the bottom of the organic substrate 320 and the PCBA 330.

Moreover, since the thermal expansion rates of the PCBA 330 (usually comprised of an organic material) and the organic substrate 320 approximately match each other, there is less stress on the solder balls 322, increasing reliability. Furthermore, the organic substrate 320 is less expensive than the ceramic substrate.

Figure 6:
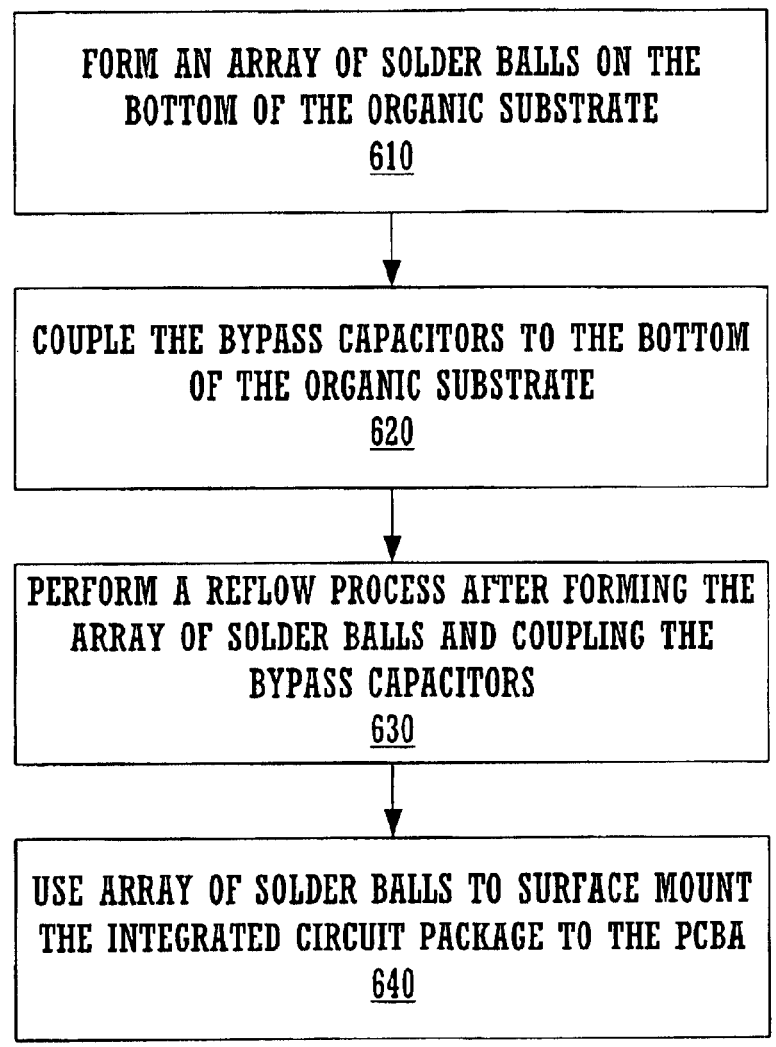
FIG. 6 illustrates a flowchart showing a method of surface mounting an integrated circuit package to a printed circuit board assembly in accordance with an embodiment of the present invention.

FIG. 6 illustrates a flowchart showing a method 600 of surface mounting an integrated circuit package to a printed circuit board assembly (PCBA) in accordance with an embodiment of the present invention.

At Step 610, an array of solder balls is formed on the bottom of the organic substrate of the integrated circuit package. Moreover, at Step 620, bypass capacitors are coupled to the bottom of the organic substrate without any cavities. At Step 630, a reflow process is performed after the array of solder balls is formed and the bypass capacitors are coupled to the bottom of the organic substrate. This facilitates a testing process.

Furthermore, at Step 640, the array of solder balls is used to surface mount the integrated circuit package to the PCBA, whereas the height of each solder ball is controlled to provide sufficient clearance for the height of the bypass capacitors. Any surface mounting technique can be utilized.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An integrated circuit package comprising:
   a package substrate having a top and a bottom;
   a plurality of bypass capacitors coupled to said bottom without a cavity; and
   an array of solder balls formed on said bottom, wherein said array of solder balls facilitates surface mounting to a printed circuit board assembly,
   wherein said solder balls provide sufficient space between said printed circuit board assembly and said bypass capacitors, and wherein a height of each solder ball is no greater than approximately 0.5 millimeters.

2. The integrated circuit package as recited in claim 1 wherein said package substrate comprises an organic substrate.

3. The integrated circuit package as recited in claim 1 further comprising a chip die coupled to said top in a flip-chip configuration.

4. The integrated circuit package as recited in claim 1 further comprising a chip die coupled to said top in a wire bonding configuration.

5. The integrated circuit package as recited in claim 1 wherein a height of each bypass capacitor is approximately between 0.325 millimeters and 0.350 millimeters.

6. The integrated circuit package as recited in claim 1 wherein a portion of said bypass capacitors are coupled within a center of said bottom.

7. An electronic assembly comprising:
   a printed circuit board assembly; and
   an integrated circuit package surface mounted to said printed circuit board assembly, wherein said integrated circuit package comprises:

a package substrate having a top and a bottom, a plurality of bypass capacitors coupled to said bottom without a cavity, and an array of solder balls formed on said bottom, wherein said array of solder balls facilitates a surface mounting technique, wherein said solder balls provide sufficient space between said printed circuit board assembly and said bypass capacitors, and wherein a height of each solder ball is no greater than approximately 0.5 millimeters.

8. The electronic assembly as recited in claim 7 wherein said package substrate comprises an organic substrate.

9. The electronic assembly as recited in claim 7 wherein said integrated circuit package further comprises a chip die coupled to said top in a flip-chip configuration.

10. The electronic assembly as recited in claim 7 wherein said integrated circuit package further comprises a chip die coupled to said top in a wire bonding configuration.

11. The electronic assembly as recited in claim 7 wherein a height of each bypass capacitor is approximately between 0.325 millimeters and 0.350 millimeters.

12. A method of surface mounting an integrated circuit package having a package substrate to a printed circuit board assembly, said method comprising:

forming an array of solder balls on a bottom of said package substrate;

coupling a plurality of bypass capacitors to said bottom without a cavity; and using said array of solder balls to surface mount said integrated circuit package to said printed circuit board assembly, wherein said solder balls provide sufficient space between said printed circuit board assembly and said bypass capacitors, and wherein a height of each solder ball is no greater than approximately 0.5 millimeters.

13. The method as recited in claim 12 wherein said package substrate comprises an organic substrate.

14. The method as recited in claim 12 wherein said integrated circuit package further comprises a chip die coupled to a top of said package substrate in a flip-chip configuration.

15. The method as recited in claim 12 wherein said integrated circuit package further comprises a chip die coupled to a top of said package substrate in a wire bonding configuration.

16. The method as recited in claim 12 wherein a height of each bypass capacitor is approximately between 0.325 millimeters and 0.350 millimeters.

17. The method as recited in claim 12 wherein said coupling said plurality of bypass capacitors includes:

coupling a portion of said bypass capacitors within a center of said bottom.

18. The method as recited in claim 12 further comprising:

performing a reflow process after forming said array of solder balls and coupling said bypass capacitors.

* * * * *